United States Patent
Jimenez et al.

(10) Patent No.: US 10,750,647 B2
(45) Date of Patent: Aug. 18, 2020

(54) REDUCING DISPLACEMENT OF SELECTED COMPONENTS DURING PRINTED CIRCUIT BOARD ASSEMBLY (PCBA) MANUFACTURING

(71) Applicant: Dell Products, L.P., Round Rock, TX (US)

(72) Inventors: Salvador D. Jimenez, Leander, TX (US); Wallace H. Ables, Georgetown, TX (US); Aaron Donald Vowell, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 258 days.

(21) Appl. No.: 15/706,354

(22) Filed: Sep. 15, 2017

(65) Prior Publication Data

US 2019/0090392 A1    Mar. 21, 2019

(51) Int. Cl.
| | |
|---|---|
| *B23P 19/00* | (2006.01) |
| *H05K 13/00* | (2006.01) |
| *H05K 13/04* | (2006.01) |
| *H05K 13/08* | (2006.01) |
| *H05K 3/30* | (2006.01) |
| *H05K 3/34* | (2006.01) |

(52) U.S. Cl.
CPC ............ *H05K 13/00* (2013.01); *H05K 3/301* (2013.01); *H05K 3/303* (2013.01); *H05K 3/306* (2013.01); *H05K 3/34* (2013.01); *H05K 3/3468* (2013.01); *H05K 13/0069* (2013.01); *H05K 13/0076* (2013.01); *H05K 13/0413* (2013.01); *H05K 13/0417* (2013.01); *H05K 13/0465* (2013.01); *H05K 13/0495* (2013.01); *H05K 13/08* (2013.01); *H05K 2201/10424* (2013.01); *H05K 2203/0165* (2013.01)

(58) Field of Classification Search
CPC .............. H05K 13/00; H05K 13/0069; H05K 13/0076; H05K 13/0417; H05K 13/0495; H05K 13/08; H05K 3/303; H05K 3/306; H05K 3/34; H05K 13/0465; H05K 3/301; H05K 3/3468; H05K 13/0413
See application file for complete search history.

(56) References Cited

U.S. PATENT DOCUMENTS

| | | | | |
|---|---|---|---|---|
| 4,900,276 A | * | 2/1990 | Doutrich | H05K 3/308 439/751 |
| 5,093,984 A | * | 3/1992 | Lape | H05K 13/0061 29/741 |
| 5,203,061 A | * | 4/1993 | Hamada | H05K 13/0417 29/33 M |
| 5,838,567 A | * | 11/1998 | Boggio, Jr. | H05K 3/00 700/121 |
| 6,691,400 B1 | * | 2/2004 | Negishi | H05K 13/041 29/740 |

(Continued)

*Primary Examiner* — Paul D Kim
(74) *Attorney, Agent, or Firm* — Fogarty LLP

(57) ABSTRACT

Systems and methods for reducing displacement of selected components during Printed Circuit Board Assembly (PCBA) manufacturing are described. In some embodiments, a PCBA manufacturing tool may include: a bar having a first end and a second end; a movable pin coupled to the first end, the movable pin configured to be inserted into a first hole of a PCB; and a fixed pin coupled to the second end, the fixed pin configured to be inserted into a second hole of the PCB.

16 Claims, 9 Drawing Sheets

(56) References Cited

U.S. PATENT DOCUMENTS

| | | | |
|---|---|---|---|
| 7,635,277 B2* | 12/2009 | Kanesashi | H01R 12/89 439/268 |
| 9,456,507 B2* | 9/2016 | Wilkins | H05K 3/4673 |
| 2012/0018084 A1* | 1/2012 | Jang | H05K 3/305 156/230 |
| 2013/0008706 A1* | 1/2013 | Tseng | H01L 23/49822 174/266 |
| 2015/0382459 A1* | 12/2015 | Tsai | H05K 3/4664 174/251 |

* cited by examiner

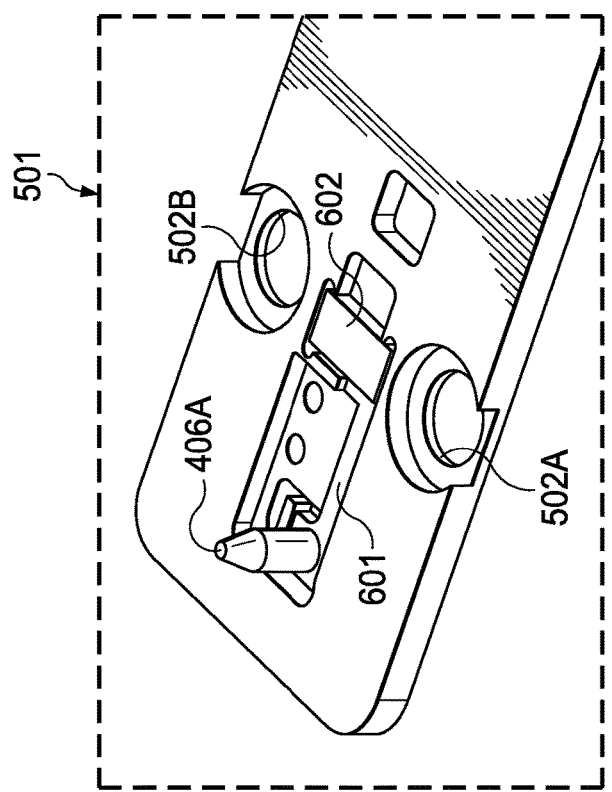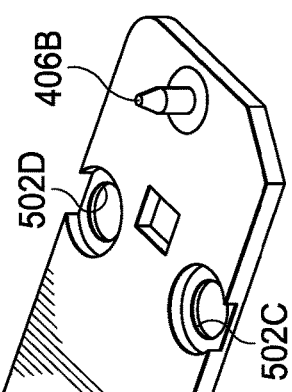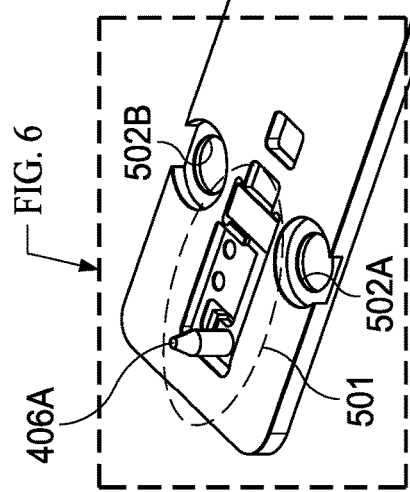

REDUCING DISPLACEMENT OF SELECTED COMPONENTS DURING PRINTED CIRCUIT BOARD ASSEMBLY (PCBA) MANUFACTURING

FIELD

The present disclosure generally relates to Printed Circuit Board Assembly (PCBA) manufacturing, and, more particularly, to systems and methods for reducing displacement of components during PCBA manufacturing.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In most implementations, an information handling system includes a number of components, such as packaged integrated circuits (ICs), capacitors, resistors, connectors, sockets, or the like that are mounted to one or more Printed Circuit Board Assemblies (PCBAs). Broadly, PCBAs are laminate based structures—sometimes referred to as motherboards, daugtherboards, or cards depending on the type of information handling system and/or the arrangement of other PCBAs within the information handling system—that mechanically support and electrically connect components via conductive tracks or pads fabricated on a non-conductive substrate. These components are usually soldered onto the PCBA, often using wave solder machines, and/or surface mount reflow ovens.

The inventors hereof have identified a need to maintain a required critical spacing and tolerances of certain components at the end of the PCBA manufacturing process. However, expansion and contraction of the Printed Circuit Board (PCB) substrate resulting from assembly thermal process steps can cause distortion and/or out-of-tolerance conditions of those components on the finished assembly. To address these, and other concerns, the inventors hereof have developed systems and methods for reducing displacement of components during PCBA manufacturing.

SUMMARY

Embodiments of systems and methods for reducing displacement of selected components during Printed Circuit Board Assembly (PCBA) manufacturing are described. In an illustrative, non-limiting embodiment, a PCBA manufacturing tool may include a bar having a first end and a second end; a movable pin coupled to the first end, the movable pin configured to be inserted into a first hole of a PCB; and a fixed pin coupled to the second end, the fixed pin configured to be inserted into a second hole of the PCB.

The first end of the bar may be configured to be coupled to a first portion of a PCBA manufacturing fixture, and the second end of the bar may be configured to be coupled to a second portion of the PCBA manufacturing fixture. The PCBA manufacturing fixture may be a wave solder or reflow fixture. The bar may have the same Coefficient of Thermal Expansion (CTE) as the PCBA. The CTE of the bar may be different than the CTE of the wave solder or reflow fixture.

The movable pin may be coupled to the first end of the bar via a spring assembly. The spring assembly may include a spring and a stopping block. The spring may be configured to maintain an absolute position of the first hole during manufacturing of the PCBA. The spring may be configured to maintain a relative position between the first and second holes during manufacturing of the PCB.

The first and second holes may be selected on opposing ends of a plurality of components mounted on the PCBA along a straight line. The stopping block may have a configurable width set to adjust a travel distance of the spring during manufacturing of the PCBA.

In another illustrative, non-limiting embodiment, a wave solder or reflow fixture may include a frame and a bar coupled to the frame, the bar comprising: a first end; a movable pin coupled to the first end and configured to be inserted into a first hole of a PCBA; a second end; and a fixed pin coupled to the second end and configured to be inserted into a second hole of the PCBA. In yet another illustrative, non-limiting embodiment, a method may include receiving a PCB and coupling the PCB to a fixture, where the fixture comprises a spring assembly configured to reduce displacement of components during a wave solder or reflow operation.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

FIG. 5 is a perspective view of an example of a tooling bar according to some embodiments.

FIG. 6 is a perspective view of an example of a spring assembly according to some embodiments.

DETAILED DESCRIPTION

Embodiments described herein comprise systems and methods for reducing displacement of selected components during Printed Circuit Board Assembly (PCBA) manufacturing. Selected components may include, for example, fewer than all components mounted onto the PCB. In various implementations, a spring-loaded mechanical retention device may be adapted to new or existing PCBA holding fixtures utilizing existing mounting features. By adjusting a spring tension force applied by its tooling pins, the mechanical retention device may control and reduce movement of the selected components during wave soldering or reflow.

In various embodiments, the mechanical retention device may have mounting holes corresponding to existing holes in an otherwise conventional PCBA holding fixture. Moreover, at least a portion of the mechanical retention device (e.g., a straight bar portion, as described below) may have the same Coefficient of Thermal Expansion (CTE) as the PCB. This limits PCB dimensional changes near the selected components, which would otherwise result from thermal excursions.

In short, systems and methods described herein may compensate for CTE mismatch between different assembly fixtures and/or materials throughout the PCBA manufacturing process' thermal excursion(s). Accordingly, these systems and methods may establish manufacturing process capabilities that provide any specified mechanical tolerance condition(s) for those selected PCBA components.

Figure 1:
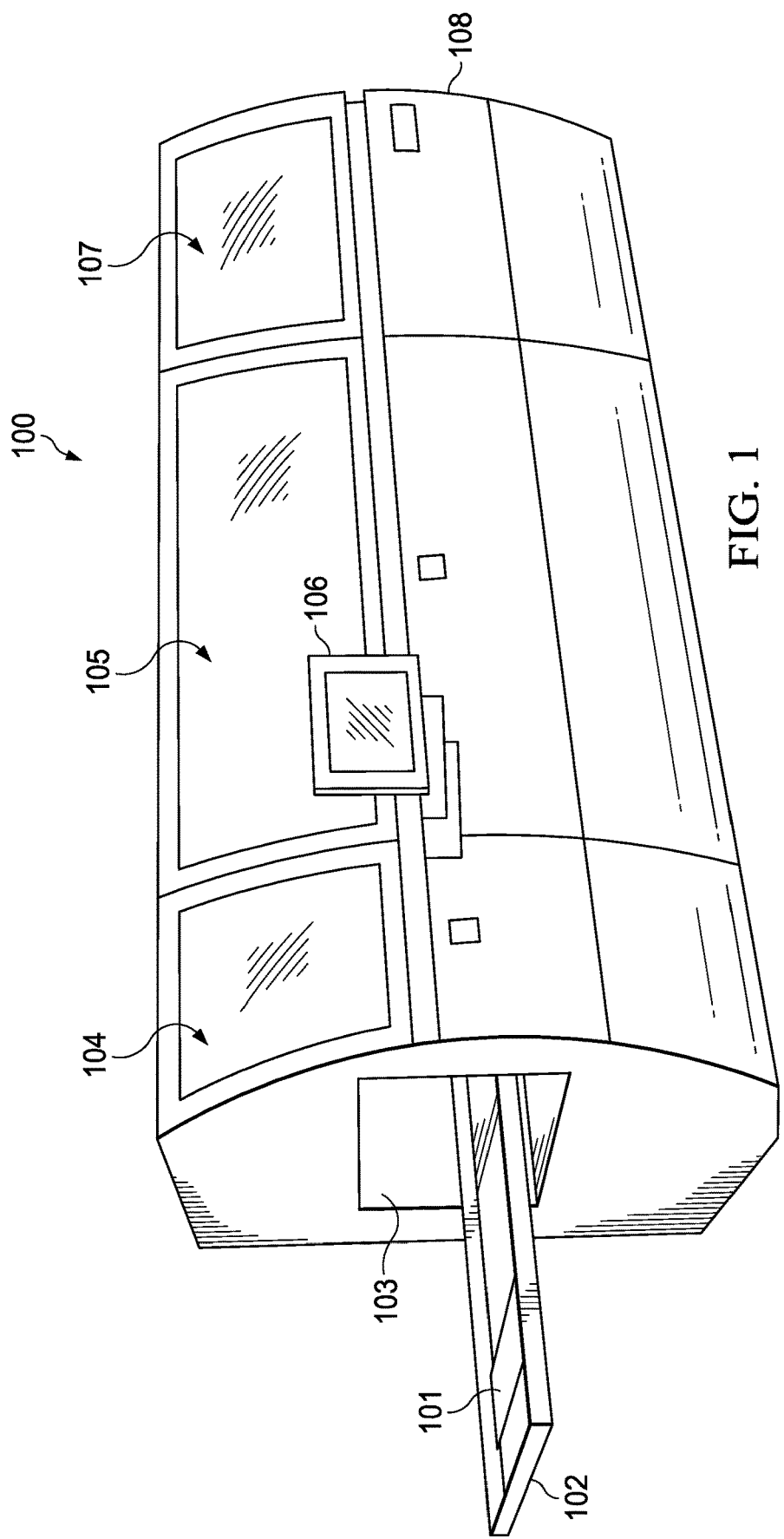
FIG. 1 is a perspective view of an example of a wave solder machine configured to employ systems and methods described herein.

Referring now to FIG. 1, a perspective view of an example of an assembly solder machine configured to employ systems and methods described herein is shown. The machine shown could represent a wave solder machine or a surface mount assembly reflow machine such as are commercially available. As part of its assembly process, a PCBA may be inserted into a wave solder (and/or reflow) machine 100 that incorporates a series of heaters to heat the PCBA prior to raising the temperature of the assembly up to or above the liquidous temperature of the solder.

In this case, the solder machine 100 may be used to perform a solder application on PCBA 101. As shown, solder machine 100 is housed within chassis 108. Conveyor 102 delivers PCBA 101 to be processed. Upon entering the solder machine 100, each PCBA 101 travels along a conveyor 102 through an opening 103, which includes a preheating area 105 and/or a fluxing area 104, used to condition PCBA 101 for soldering. Then, soldering area 107 applies solder material to PCBA 101, or raises the temperature of the assembly above the liquidous temperature of the solder. Information Handling System (IHS) or controller 106 is provided to automate, monitor and/or control operation of solder machine 100.

Figure 2:
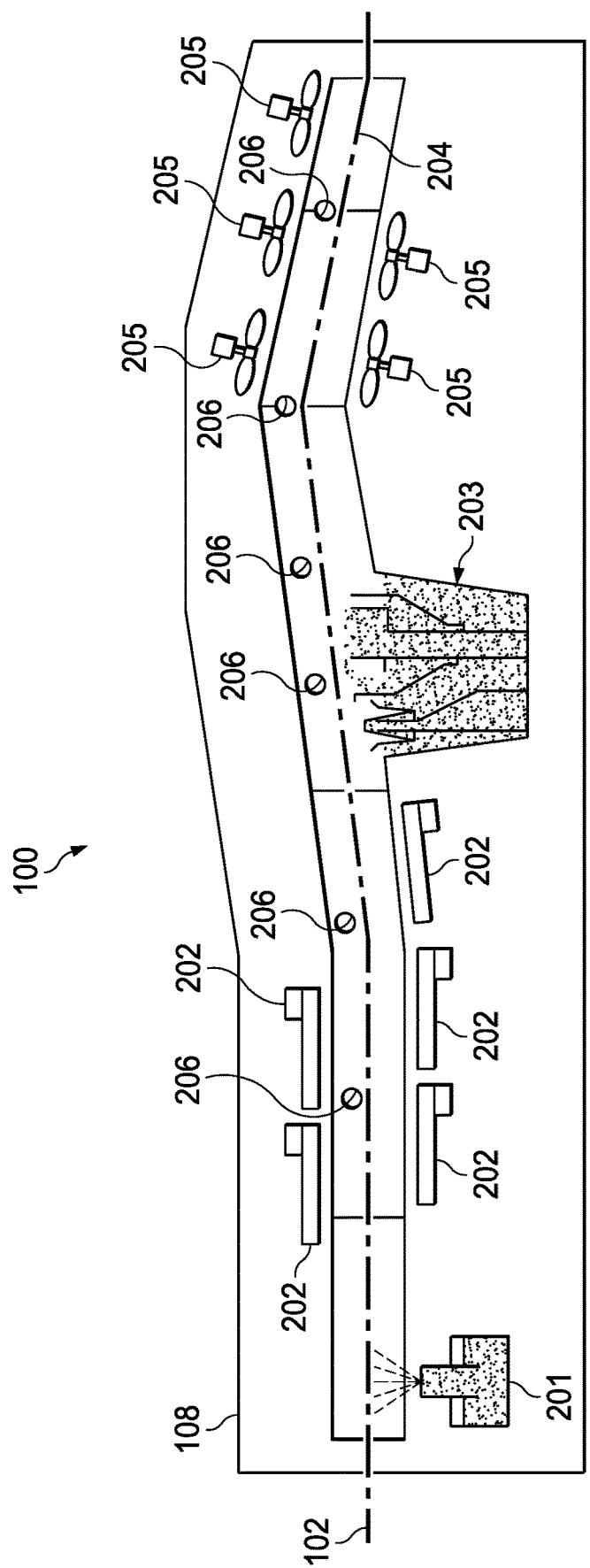
FIG. 2 is a cross-sectional view of the wave solder machine configured to employ systems and methods described herein.

FIG. 2 shows cross-sectional view of solder machine 100. Under control of IHS 106, conveyor 102 carries PCBAs 101 into chassis 108 through flux addition zone 201 (if needed), pre-heaters 202, soldering zone 203, and cooling zone 204. Fluxer 201 may be any suitable foam or spray fluxer, and pre-heaters 202 may be hot plate or platen, tubular electric, hot air, ceramic, and/or infrared heaters. Soldering zone 203 may be any suitable wave soldering pot with turbulent and/or laminar flow solder, additional high temperature heaters, vapor phase immersion areas, or laser heating areas. Cooling source 205 may include fans 205, an air conditioning device, or the like.

Soldering zone 203 may include a solder pot having one or more chambers. Soldering zone 203 may also include a pump and nozzle system that continuously moves solder through the nozzle; such that any excess flows back into the solder pot. Sensors 206 may include any type of sensor usable by IHS 106 to control various aspects of the process performed by solder machine 100 upon PCBA 101.

Figure 3:
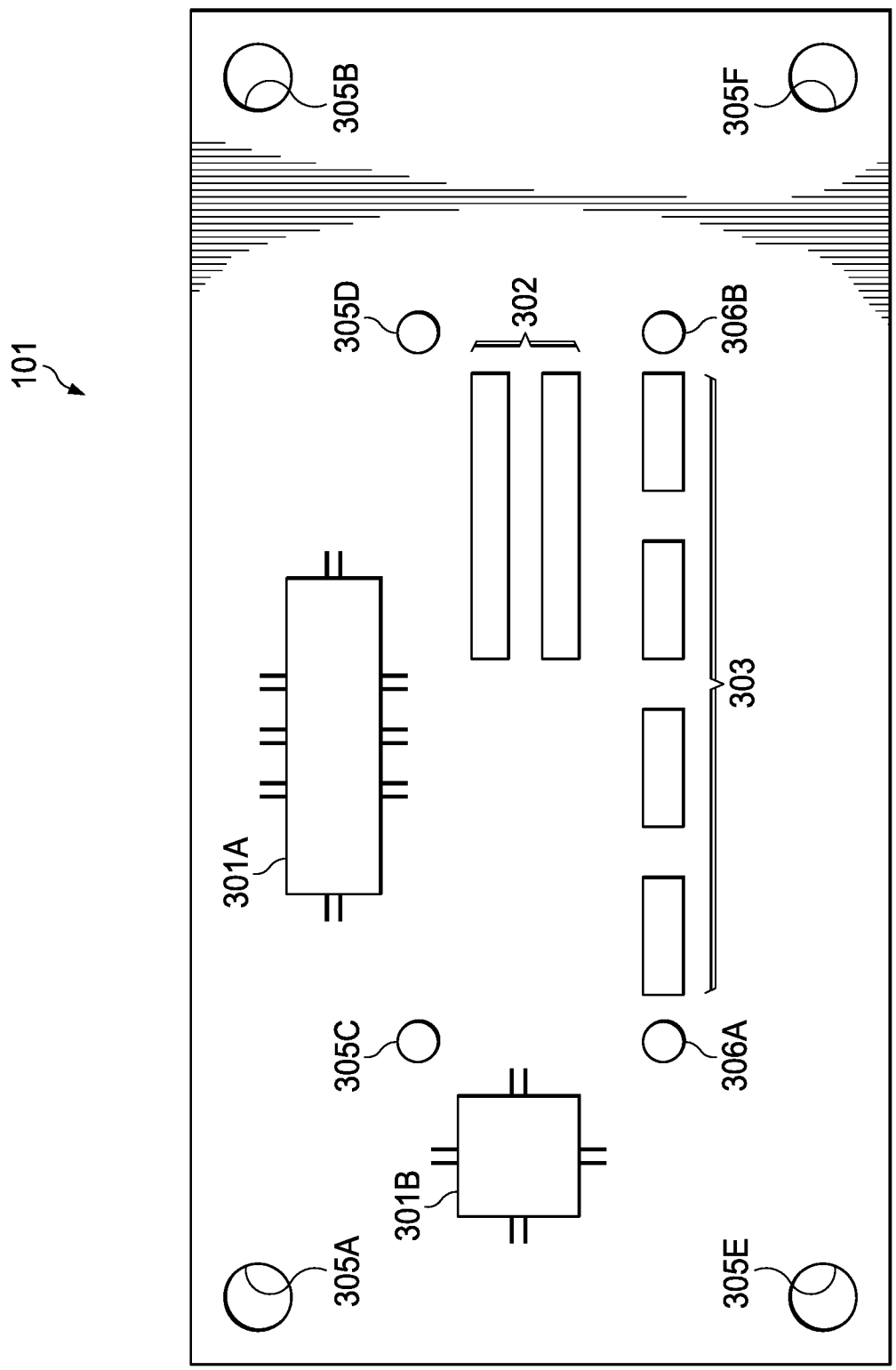
FIG. 3 is a top view of an example of a Printed Circuit Board (PCB) manufactured using systems and methods described herein.

FIG. 3 is a top view of an example of PCBA 101 manufactured using systems and methods described herein. As shown, PCBA 101 may include a number of components 301A and 301B coupled thereto. Examples of components 301A and 301B include, but are not limited to, integrated circuits (ICs), capacitors, resistors, diodes, inductors, oscillators, crystals, transistors, etc.

In addition, PCBA 101 includes sockets or connectors 302 and 303. For example, PCBA 101 may be connected to another PCBA (e.g. a "daughter board") or other components using sockets or connectors 302 and 303 using any suitable IHS signaling protocol. In this case, sockets or connectors 303 are disposed on PCBA 101 along a straight line, and are selected as the components with most strict positioning requirements.

For example, connectors 303 may be selected in cases where each individual one of connectors 303 is a female connector configured to receive a corresponding male counterpart, also disposed in a straight line. These male connectors may be part of the same riser card (i.e., another PCB or PCBA in the same IHS), such that a more strict alignment of connectors 303 (e.g., relative to other, non-selected components) is necessary.

PCBA 101 also includes mounting holes 305A-F distributed across PCB 101. Mounting holes 305A-F allow PCBA 101 to be mounted within an IHS using clips, screws, or other fasteners. In addition, during manufacturing, mounting holes 305A-F may be used to temporarily couple PCBA 101 to an assembly soldering fixture, such that PCBA 101 may be securely put on conveyor 102.

Still with respect to FIG. 3, FR-4 glass epoxy is often the primary insulating substrate used in PCBA 101, but could be any of the commercially available resins, epoxies, polyester, paper, ceramic, etc. type material. An insulating material with a thin layer of copper foil plated or laminated to one or both sides may be used.

Figure 4:
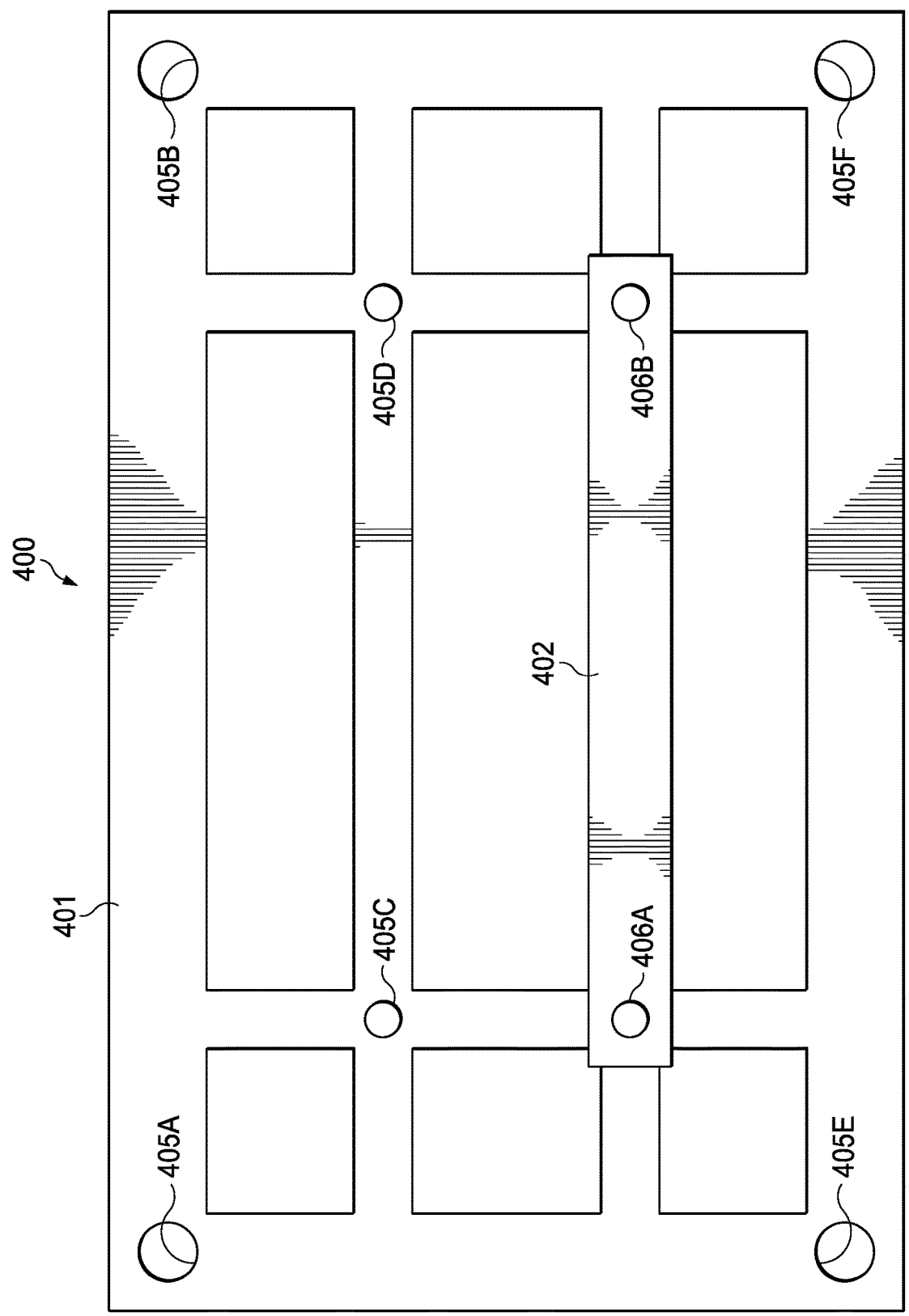
FIG. 4 is a top view of an example of a wave solder fixture according to some embodiments.

FIG. 4 is a top view of an example of a soldering fixture 400 according to some embodiments. As shown, fixture 400 includes frame 401, which may be adjustable or made specifically for a particular PCBA form factor or profile. Frame 401 includes a number of mounting holes (or pins) 405A-F, one or more of which are located in the same X-Y position as a corresponding one of holes 305A-F of PCBA 101, such that PCBA 101 may be attached to frame 401 using matching hole and/or hole-pin pairs.

Fixture 400 also includes spring-loaded tooling bar 402, which includes movable pin 406A and fixed pin 406B, discussed in more detail below. Although only one tooling bar 402 is shown in FIG. 4, it should be noted that more tooling bars may be used in the same fixture to reduce displacement of different sets of components. For instance, two or more tooling bars may be disposed perpendicularly with respect to each other on the same frame (e.g., a second tooling bar may be placed between holes 405A and 405E, at a 90° angle with respect to tooling bar 402).

In some implementations, tooling bar 402 may have the same Coefficient of Thermal Expansion (CTE) as PCBA 101. For example, tooling bar 402 and/or elements thereof may be fabricated using an FR-4 panel or the like. Additionally or alternatively, the CTE of tooling bar 402 may be different from the CTE of frame 401.

FIG. 5 is a perspective view of an example of tooling bar 402, according to some embodiments. As shown, tooling bar 402 has a first end and a second end. Movable pin 406A is coupled to the first end and, in this case, it is configured to be inserted into hole 306A of PCBA 101. Conversely, fixed pin 406B is coupled to the second end and is configured to be inserted into hole 306B of PCBA 101, such that tooling bar 402 extends across sockets or connectors 303.

To reduce the displacement of components during a wave soldering or reflow operation performed upon PCBA 101, movable pin 406A may be coupled to tooling bar 402 via spring assembly 501, discussed in more detail below. Holes 502A-D may be used to attach tooling bar 402 onto frame 401.

Figure 7:
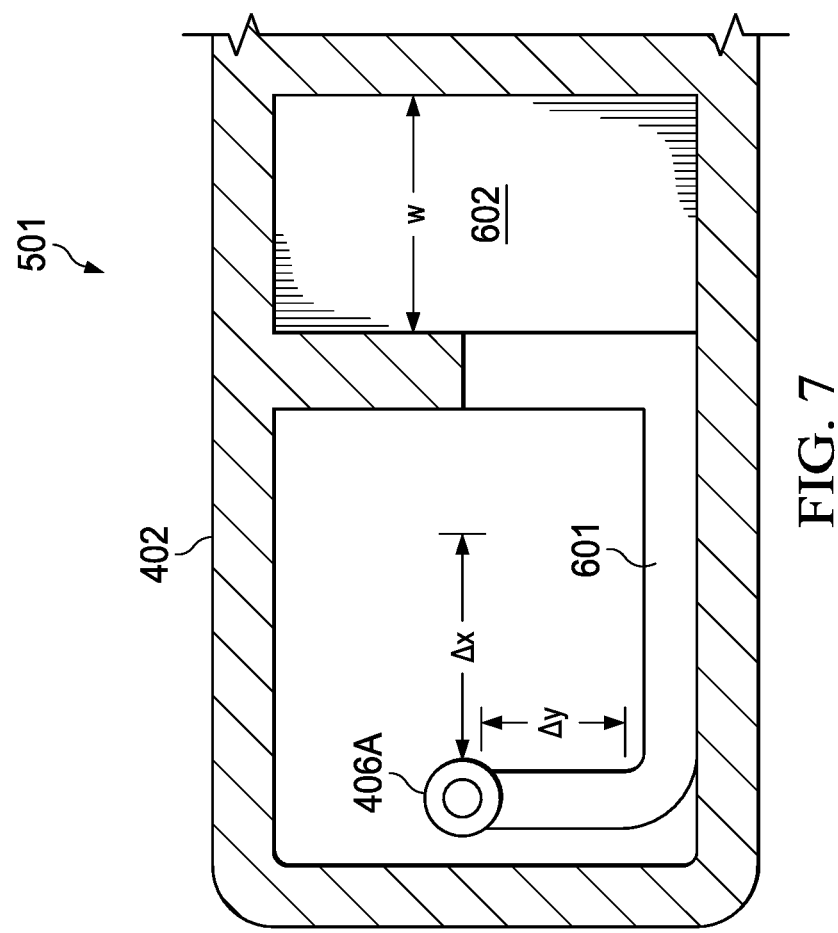
FIG. 7 is a top view of an example of a leaf spring and of stopping block according to some embodiments.

FIG. 6 is a perspective view of an example of spring assembly 501 including leaf spring 601 (e.g., an arc-shaped length of spring steel of rectangular cross-section) and stopping block 602. FIG. 7 shows a top view of those elements according to some embodiments. As shown, movable pin 406A is coupled to the tip of leaf spring 601. Compression of leaf spring 601 is controllable or limited depending upon the selected width (w) of stopping block 602, which controls the maximum travel distances (Δx and/or Δy) of movable pin 406A in the direction of sockets or connectors 303. In various embodiments, the leaf spring 601 may be replaced by a spring comprised of coiled spring steel.

Figure 8:
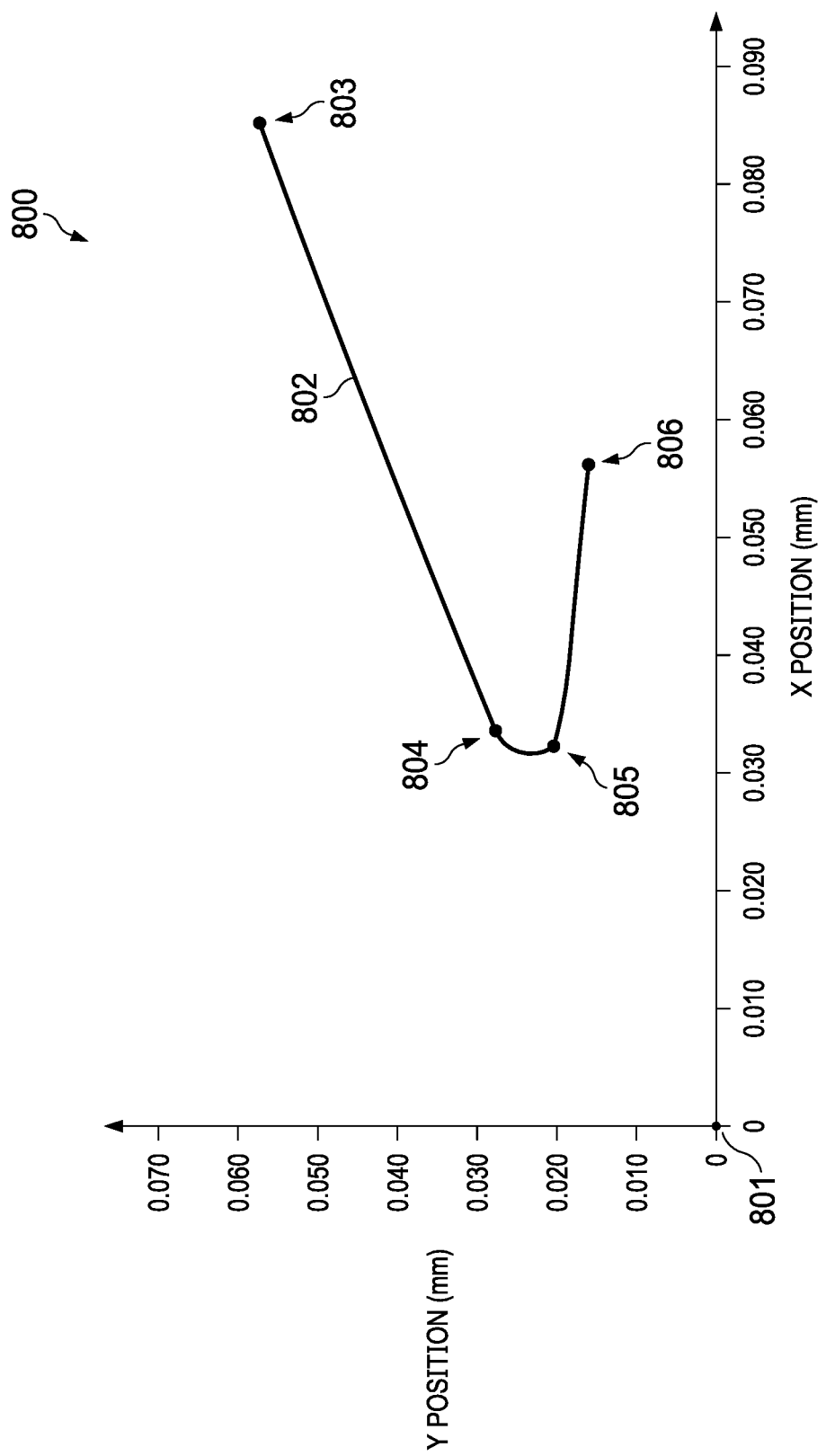
FIG. 8 is a graph showing displacement of components of the PCB without employing systems and methods described herein.
Figure 9:
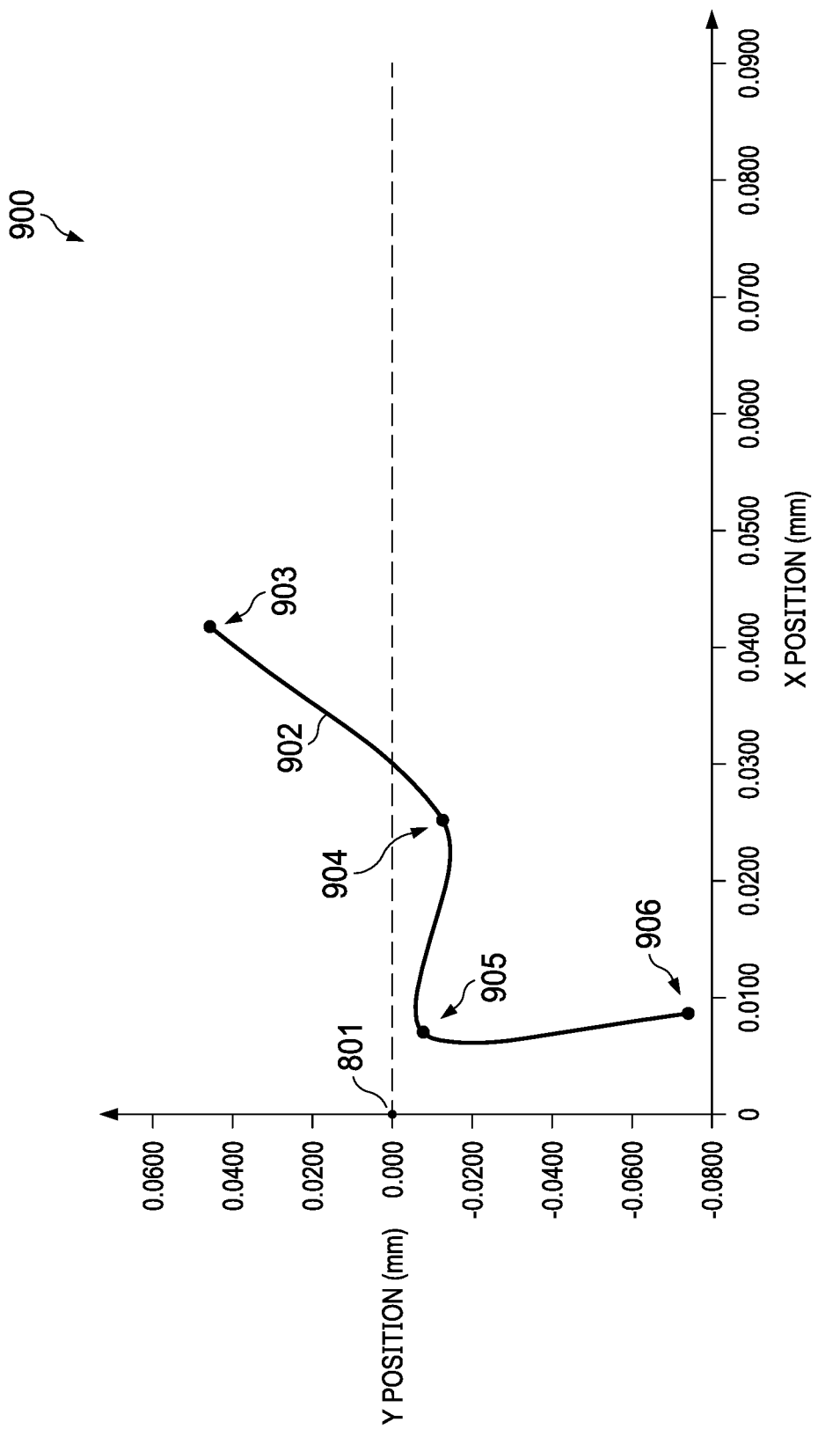
FIG. 9 is a graph illustrating displacement of components of the PCB employing systems and methods described herein.

With respect to FIGS. 8 and 9, graph 800 illustrates the displacement of components of PCBA 101 as result of manufacturing solder operations without employing systems and methods described herein, and graph 900 illustrates the displacement when employing systems and methods described herein.

In graphs 800 and 900, assume that computer aided design (CAD) data target location 801 for a particular feature or component of PCBA 101 is at the X=0 and Y=0 coordinates (e.g., the location of mounting hole 306A). Lines 802 and 902 show position changes experienced by some features or components on PCBA 101 during the manufacturing process. Points 803 and 903 represent the X-Y location of that feature or component when incoming PCBA 101 enters the first assembly solder machine 100. Points 804 and 904 show the position of the feature or component after a bottom reflow process (bottom portion of PCBA 101). Points 805 and 905 show the position of the feature or component after a top reflow process (top portion of PCBA 101). And points 806 and 906 show the position of the feature or component after the wave soldering process in completed.

As illustrated in graphs 800 and 900, systems and methods described herein operate to maintain an absolute position of mounting hole 306A and/or a relative position between mounting holes 306A and 306B during manufacturing of the PCBA 101 in order to avoid displacement of selected components 303. Particularly, the physical displacement of those mounting holes as result of thermal fluctuations suffered by PCBA 101 during the manufacturing soldering process is reduced by the action of spring-loaded, tooling bar 402. Leaf-spring 601 and stopping block 602 act upon movable pin 406A to reduce the movement or displacement of mounting holes 306A and/or 306B.

In various implementations, the strength or tension of spring 401 necessary to maintain these absolute or relative positions may be empirically determined based upon one or more test operations in anticipation of production.

By constraining or restricting the possible drift of mounting holes 306A and/or 306B due to thermal variations, systems and methods described herein ensure that connectors or sockets 303 remain aligned with each other within a selected tolerance level. This characteristic may be particularly useful for example, in applications where a "riser card" (that is, another PCBA with its own components) having multiple, fixed connectors disposed in line is coupled to PCBA 101 via connectors 303. Without the systems and methods described herein, PCBA 101 may potentially leave manufacturing solder machine 100 with connectors 303 in misalignment, which can make it difficult or impossible for them to receive or mate to the riser card.

Although tooling bar 402 is shown with one movable pin 406A and one fixed pin 406B, a person of ordinary skill in the art will recognize in light of this disclosure that other tooling bar implementations may include any number of movable and/or fixed pins. For example, a first movable pin may have a leaf spring assembly in the X-direction, and a second movable pin on the same tooling bar may have another leaf spring assembly in the Y-direction. Additionally or alternatively, two or more leaf spring assemblies, each in a different direction, may be coupled to the same movable pin of tooling bar 402.

Although tooling bar 402 is shown as single, straight bar, in many cases tooling bar 402 may assume different shapes, and may include multiple arms coupled together in any suitable manner. For example, two straight bars of same or different lengths may be coupled to one another at a predetermined angle (e.g., 90°), each bar having a leaf spring assembly.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, science, control, or other purposes. For example, an IHS may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The IHS may include random access memory (RAM), one or more processing resources such as a central processing unit (CPU) or hardware or software control logic, read only memory (ROM), and/or other types of nonvolatile memory. Additional components of the IHS may include one or more disk drives, one or more network ports for communicating with external devices as well as various input and output (I/O) devices, such as a keyboard, a mouse, touchscreen and/or a video display. The IHS may also include one or more buses operable to transmit communications between the various hardware components.

Figure 10:
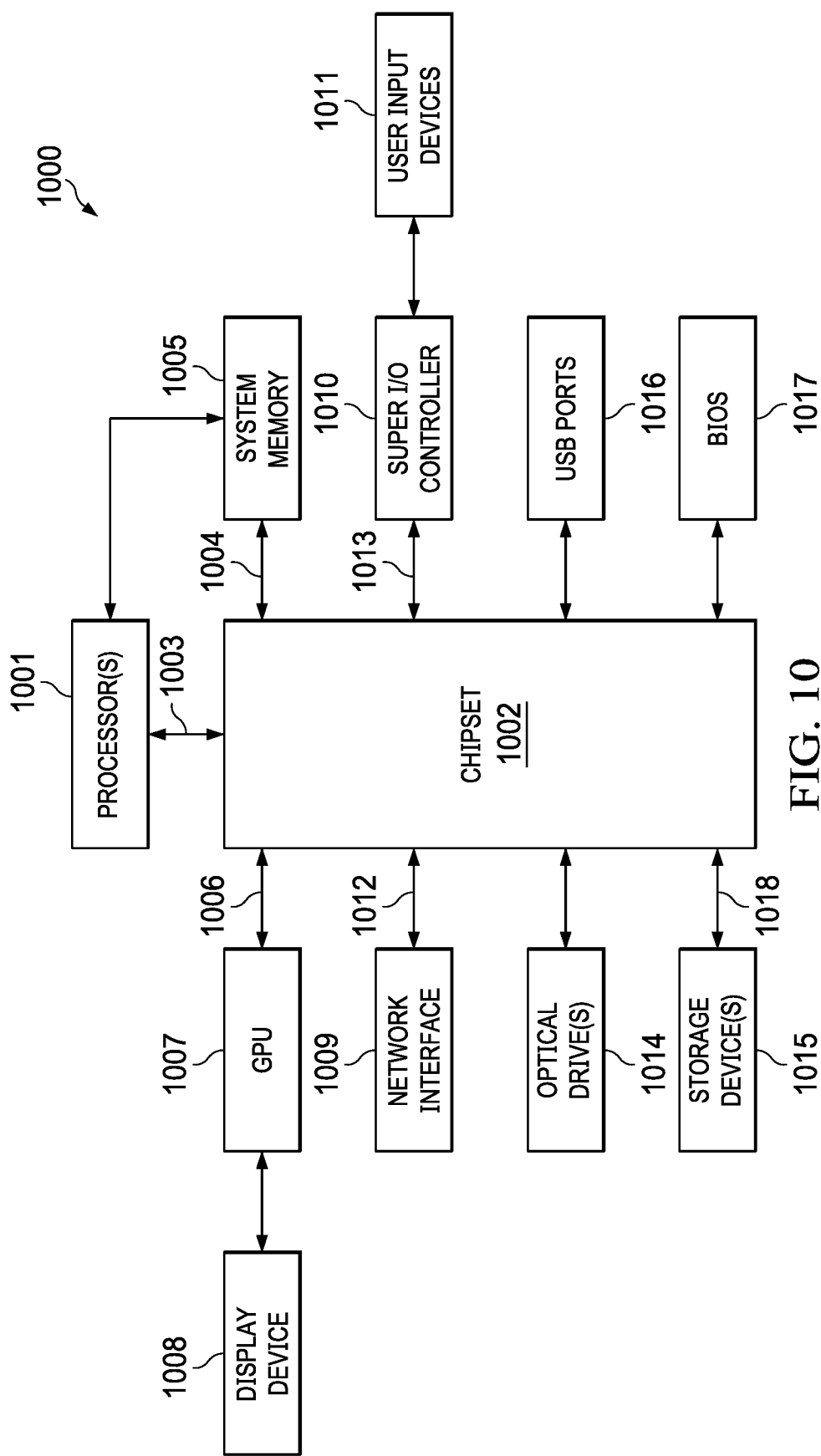
FIG. 10 is a block diagram illustrating example components of an information handling system according to some embodiments.

FIG. 10 illustrates example components of IHS 1000 according to some embodiments. In various embodiments, one or more of IHS 1000's components (or a portion(s) thereof) may be mounted on a PCB such as a motherboard, which has been assembled and/or soldered using a wave soldering or reflow machine using an assembly fixture having a tooling bar as described herein.

As shown, IHS 1000 includes one or more processors 1001. In various embodiments, IHS 1000 may be a single-processor system including one processor 1001, or a multi-processor system including two or more processors 1001. Processor(s) 1001 may include any processor capable of executing program instructions, such as any general-purpose or embedded processor implementing any of a variety of Instruction Set Architectures (ISAs).

IHS 1000 comprises chipset 1002 that may include one or more integrated circuits that are connected to processor(s) 1001. In certain embodiments, chipset 1002 may utilize QPI (QuickPath Interconnect) bus 1003 for communicating with the processor(s) 1001. Chipset 1002 provides processor(s) 1001 with access to a variety of resources. For instance, chipset 1002 provides access to system memory 1005 over memory bus 1004. (Additionally or alternatively, system memory 1005 may be coupled directly to processor(s) 1001.)

System memory 1005 may be configured to store program instructions and/or data accessible by processors(s) 1001. In various embodiments, system memory 1005 may be implemented using any suitable memory technology, such as static RAM (SRAM), dynamic RAM (DRAM) or nonvolatile/Flash-type memory.

Chipset 1002 may also provide access to Graphics Processing Unit (GPU) 1007. In certain embodiments, graphics processor 1007 may be part of one or more video or graphics cards that have been installed as components of IHS 1000. Graphics processor 1007 may be coupled to the chipset 1002 via graphics bus 1006 such as provided by an AGP (Accelerated Graphics Port) bus or a PCIe (Peripheral Component Interconnect Express) bus. In certain embodiments, the functionality of graphics processor 1007 and the graphics bus 1006 may be an embedded function in the chipset 1002. In certain embodiments, GPU 1007 generates display signals and provides them to display device 1008.

In certain embodiments, chipset 1002 may also provide access to one or more user input devices 1011. In such embodiments, chipset 1002 may be coupled to a super input/output (I/O) controller 1010 that provides interfaces for a variety of user input devices 1011, in particular lower bandwidth and low data rate devices.

For instance, super I/O controller 1010 may provide access to a keyboard and mouse or other peripheral input devices. In certain embodiments, super I/O controller 1010 may be used to interface with coupled user input devices 1011 such as keypads, biometric scanning devices, and voice or optical recognition devices. These I/O devices may interface with super I/O controller 1010 through wired or wireless connections. In certain embodiments, chipset 1002 may be coupled to super I/O controller 1010 via Low Pin Count (LPC) bus 1013. Alternatively, bus 1013 may use a Serial Peripheral Interface (SPI) communication protocol, an Inter-Integrated Circuit (I2C) protocol, any of the Intelligent Platform Management Interface (IPMI) protocols like System Management Bus (SMBus), Power Management Bus (PMBus), or Intelligent Platform Management Bus (IPMB).

Other resources may also be coupled to processor(s) 1001 of IHS 1000 through chipset 1002. In certain embodiments, chipset 1002 may be coupled to a network interface 1009, such as provided by a Network Interface Controller (NIC) that is coupled to IHS 1000. In certain embodiments, network interface 1009 may be coupled to chipset 1002 via PCIe bus 1012. According to various embodiments, network interface 1009 may also support communication over various wired and/or wireless networks and protocols (e.g., Wi-Fi, Bluetooth, etc.). In certain embodiments, chipset 1002 may also provide access to one or more Universal Serial Bus (USB) ports 1016.

Chipset 1002 also provides access to one or more storage devices 1015 using bus interface connection 1018, which may be implemented following any suitable standards such as PCIe, SAS, SATA, nVME, PCI, PCIX, etc. In certain embodiments, chipset 1002 may also provide access to other types of storage devices. For instance, storage device 1015, in IHS 1000 may utilize one or more magnetic media storage devices, one or more solid state memory storage devices, or other types of the storage devices such as optical drive(s) 1014 or a removable-media drive. In various embodiments, solid state storage device 1015 may be integral to IHS 1000, or may be located remotely from IHS 1000.

Upon powering or restarting IHS 1000, processor(s) 1001 may utilize instructions stored in Basic Input/Output System (BIOS) or Unified Extensible Firmware Interface (UEFI) chip 1017 to initialize and test hardware components coupled to IHS 1000 and to load an Operating System (OS) for use by IHS 1000. Generally, BIOS 1017 provides an abstraction layer that allows the OS to interface with certain hardware components that utilized by IHS 1000. It is through this hardware abstraction layer that software executed by the processor(s) 1001 of IHS 1000 is able to interface with I/O devices that are coupled to IHS 1000.

In various embodiments, IHS 1000 may not include each of the components shown in FIG. 10. Additionally or alternatively, IHS 1000 may include various components in addition to those that are shown. Furthermore, some components that are represented as separately may, in other embodiments, be integrated with other components. For example, in various implementations, all or a portion of the functionality provided by the illustrated components may instead be provided by components integrated into the one or more processor(s) 1001 as a system-on-a-chip (SOC) or the like.

It should be understood that various operations described herein may be implemented in software or software modules executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements that such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A Printed Circuit Board Assembly (PCBA) manufacturing tool, comprising:
   a bar having a first end and a second end, wherein the first end of the bar is configured to be coupled to a first portion of a wave solder or reflow fixture, and wherein the second end of the bar is configured to be coupled to a second portion of the wave solder or reflow fixture;
   a movable pin coupled to the first end, the movable pin configured to be inserted into a first hole of a Printed Circuit Board (PCB); and
   a fixed pin coupled to the second end, the fixed pin configured to be inserted into a second hole of the PCB.

2. The PCBA manufacturing tool of claim 1, wherein the bar has a same Coefficient of Thermal Expansion (CTE) as the PCB.

3. The PCBA manufacturing tool of claim 2, wherein the CTE of the bar is different than a CTE of the wave solder or reflow fixture.

4. The PCBA manufacturing tool of claim 1, wherein the movable pin is coupled to the first end via a spring assembly.

5. The PCBA manufacturing tool of claim 4, wherein the spring assembly comprises a spring and a stopping block.

6. The PCBA manufacturing tool of claim 5, wherein the spring is configured to maintain an absolute position of the first hole.

7. The PCBA manufacturing tool of claim 5, wherein the spring is configured to maintain a relative position between the first and second holes.

8. The PCBA manufacturing tool of claim 7, wherein the first and second holes are selected on opposing ends of a plurality of components mounted on the PCB along a straight line.

9. The PCBA manufacturing tool of claim 5, wherein the stopping block has a configurable width set to adjust a travel distance of the spring.

10. A wave solder or reflow fixture, comprising:
    a frame; and
    a bar coupled to the frame, the bar comprising:
      a first end;
      a movable pin coupled to the first end and configured to be inserted into a first hole of a Printed Circuit Board (PCB);
      a second end; and
      a fixed pin coupled to the second end and configured to be inserted into a second hole of the PCB, wherein the bar has a same Coefficient of Thermal Expansion (CTE) as the PCB.

11. The wave solder or reflow fixture of claim 10, wherein the movable pin is coupled to the first end via a spring assembly comprising: a leaf spring or coil spring and a stopping block.

12. The wave solder or reflow fixture of claim 11, wherein the spring is configured to maintain a position of the first hole, and wherein the stopping block is configured to adjust a travel distance of the spring.

13. The wave solder or reflow fixture of claim 12, wherein the spring is configured to maintain an absolute position of the first hole.

14. The wave solder or reflow fixture of claim 12, wherein the spring is configured to maintain a relative position between the first and second holes.

15. The wave solder or reflow fixture of claim 12, wherein the first and second holes are selected on opposing ends of a plurality of components mounted on the PCB along a straight line.

16. The wave solder or reflow fixture of claim 12, wherein the stopping block has a configurable width set to adjust a travel distance of the spring.

* * * * *